United States Patent
Palmer

(10) Patent No.: US 9,690,198 B2
(45) Date of Patent: Jun. 27, 2017

(54) INCREASING AND CONTROLLING SENSITIVITY OF NON-LINEAR METALLIC THIN-FILM RESISTS

(71) Applicant: Nikon Corporation, Tokyo (JP)

(72) Inventor: Shane R. Palmer, Oro Valley, AZ (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 14/642,349

(22) Filed: Mar. 9, 2015

(65) Prior Publication Data

US 2015/0253668 A1    Sep. 10, 2015

Related U.S. Application Data

(60) Provisional application No. 61/950,691, filed on Mar. 10, 2014.

(51) Int. Cl.
*G03F 7/09*   (2006.01)
*G03F 7/11*   (2006.01)
(Continued)

(52) U.S. Cl.
CPC ............ *G03F 7/095* (2013.01); *G03F 7/0043* (2013.01); *G03F 7/091* (2013.01); *G03F 7/094* (2013.01); *G03F 7/2041* (2013.01)

(58) Field of Classification Search
None
See application file for complete search history.

(56) References Cited

U.S. PATENT DOCUMENTS 4,000,492 A * 12/1976 Willens .................. G03C 1/705
                                                  346/135.1
4,237,468 A * 12/1980 Nahara .................. G03C 1/705
                                                  346/135.1
(Continued)

FOREIGN PATENT DOCUMENTS

JP     06-131693    *  5/1994
JP     07-093808    *  4/1995
(Continued)

OTHER PUBLICATIONS

Jensen, "Onion's fusible alloy", J. Chem. Educ. vol. 87 pp. 1050-1051 (2010).*

(Continued)

*Primary Examiner* — Martin Angebranndt
(74) *Attorney, Agent, or Firm* — Yakov Sidorin; Quarles & Brady LLP

(57) ABSTRACT

Non-linear metallic thermal resist structure having more than two layers of different metals and effective eutectic temperature that is lower than eutectic temperature of a reference non-linear metallic thermal resist having only two layer of same different metals. Optionally, at least one the layers of such resist structure is doped with material different from host metals and/or deposited under conditions resulting in strain or stress in a layer at hand. Method of multi-exposure-based patterning of a substrate carrying such structure with laser pulses characterized by irradiance at levels equal to or below 10 mJ/cm$^2$. The sequence of steps producing the required pattern on the substrate may be explicitly lacking a step of removal of a portion of the resist structure between two consecutive exposures.

18 Claims, 11 Drawing Sheets

(51) Int. Cl.
  G03F 7/16    (2006.01)
  G03F 7/095   (2006.01)
  G03F 7/004   (2006.01)
  G03F 7/20    (2006.01)

(56) References Cited

U.S. PATENT DOCUMENTS

| | | | | |
|---|---|---|---|---|
| 4,242,439 | A * | 12/1980 | Izu | G03C 1/705 |
| | | | | 430/269 |
| 4,296,419 | A * | 10/1981 | Terao | G11B 7/243 |
| | | | | 346/135.1 |
| 4,477,819 | A * | 10/1984 | Lee | G01D 15/34 |
| | | | | 346/135.1 |
| 4,567,104 | A | 1/1986 | Wu | |
| 4,845,515 | A * | 7/1989 | Suh | G11B 7/24 |
| | | | | 327/484 |
| 5,273,860 | A * | 12/1993 | Nishida | G11B 7/24067 |
| | | | | 346/135.1 |
| 6,641,978 | B1 * | 11/2003 | Chapman | G03F 7/0042 |
| | | | | 430/270.1 |
| 7,276,274 | B2 * | 10/2007 | Inoue | G11B 7/24038 |
| | | | | 369/284 |
| 7,781,146 | B2 * | 8/2010 | Kakiuchi | G11B 7/24038 |
| | | | | 369/283 |
| 7,989,146 | B2 | 8/2011 | Burberry et al. | |
| 2004/0157158 | A1 * | 8/2004 | Kakiuchi | G11B 7/24067 |
| | | | | 430/270.12 |

FOREIGN PATENT DOCUMENTS

| | | | |
|---|---|---|---|
| JP | 2010-084228 | * | 4/2010 |
| WO | 0206897 A2 | | 1/2002 |

OTHER PUBLICATIONS

Devasia, "Analyzing residual stress in bilayer Ge2Se2/SnTe films", Thin. Sol. Films., vol. 517 pp. 6516-6519 (2009).*

Ibrahim, "Ion Beam mixing and thermoelectric charachteristics of Bi—Sb thin film alloys", Thesis McMaster University (Aug. 1986) 128 pages.*

Suh "Optical recording in multilayer Bi/Se thin films", Proc. SPIE 695 pp. 16-19 (1986).*

Miller et al., "A gallium-Arsenide laser facsimile printer", The Bell Sys. Techni. J., vol. 58(9) pp. 1909-1998 (Nov. 1979).*

Dykes et al., "Bimetallic thermal resists potential for double exposure immersion lithography and greyscale photomasks", Proc. SPIE., vol. 6730 (10 pages) (2007).*

Tu et al. "Bimetallic thermal activated films for photomask, micromachining and microfabrication" Thesis Simon Fraser University (Dec. 2004).*

J.K. Chen et al., "Inorganic Resist Film for Submicron Structure Fabrication", IUMRS-ICA 2011, Procedia Engineering 36 (2013); pp. 482-487.

G.H. Chapman, M.V. Sarunic, Y. Tu, "A Prototype Laser Activated Bimetallic Thermal Resist for Microfabrication", SPIE Proceedings Laser Applications in Microelectronics and Optoelectronics Applications, v 4274, pp. 183-193, San Jose, CA 2001.

M.V. Sarunic, G.H. Chapman, Y. Tu, "BiIn: a Sensitive Bimetallic Thermal Resist", SPIE Advances in Resist Technology and Processing XVIII v. 4345, pp. 557-567, Santa Clara, CA Mar. 2001.

Richard Y. Tu, "Bi-Metallic Thermal Resists for Photomask, Micromachining and Microfabrication", Ph.D. Dissertation, Simon Fraser University, Dec. 2004.

Y. Tu and G. Chapman,, "Inorganic Bi/In Thermal Resist as a High-Etch Ratio Patterning Layer for CF4/CHF3/O2 Plasma Etch," Proc. of SPIE vol. 5376, pp. 867-878 (2007).

Kenji Lai, Masoa Nakumura, W. Kundihikanjani, M. Kawasaki, Y. Tokura , M. Kelly and Z. Shen, "Mesocopic Percolated Resistance Network in a Strained Manganite Thin Film", Science vol. 329, Jul. 9, 2010.

Roger H. French, et al., "Long Range Interactions in Nanoscale Science", Reviews of Modern Physics, pp. 1887-1944, vol. 82, Apr.-Jun. 2010.

Y. Tu, et al., "Bimetallic Thermal Activated Films for Microfabrication, Photomasks and Data Storage", SPIE Photonics West, Laser Applications in Microelectronics and Optoelectronics Applications; pp. 1-11; Jan. 2002.

* cited by examiner

Bismuth[83]

Rhombohedral Structure, $T_{melt}$ = 271 °C $n = 1.92$, $k = 1.2$, $\alpha = 8.9 \times 10^5$ m$^{-1}$ Thermal Conductivity (K) = 7.87 W/m-K Mass Density ($\rho$) = 9780 kg/m$^3$ Specific Heat ($C_p$) = 122 J/kg-K

Indium[49]

Tetragonal Structure, $T_{melt}$ = 156.6 °C $n = 0.24$, $k = 1.72$, $\alpha = 1.78 \times 10^6$ m$^{-1}$ Thermal Conductivity (K) = 81.6 W/m-K Mass Density ($\rho$) = 7310 kg/m$^3$ Specific Heat ($C_p$) = 233 J/kg-K

Amorphous Hydrogenated Carbon[6]

$n = 1.7$, $k = 0.39$, $\alpha = 2.9 \times 10^5$ m$^{-1}$

Thermal Conductivity (K) = 0.8 W/m-K

Mass Density ($\rho$) = 1700 kg/m$^3$

Specific Heat ($C_p$) = 300 J/kg-K

Silicon[14]

$n = 0.88$, $k = 2.764$, $\alpha = 1.798 \times 10^6$ m$^{-1}$

Thermal Conductivity (K) = 148.0 W/m-K

Mass Density ($\rho$) = 2332 kg/m$^3$

Specific Heat ($C_p$) = 710 J/kg-K

Water $n = 1.4358$, $k = 0.001$

Thermal Conductivity (K) = 0.607 W/m-K

Mass Density ($\rho$) = 998 kg/m$^3$

Specific Heat ($C_p$) = 4183 J/kg-K

Bi$_{53}$In$_{47}$

Assumed: $n = 1.7$, $k = 1.3$

Thermal Conductivity (K) = 52.0 x 10 W/m-K ?

Mass Density ($\rho$) = 8619 kg/m$^3$ kg/m$^3$ ?

Specific Heat ($C_p$) = 210 J/kg-K ?

Enthalpy change from Bi: In to alloy: estimated at 3.5 J to 5.0 J

FIG. 3

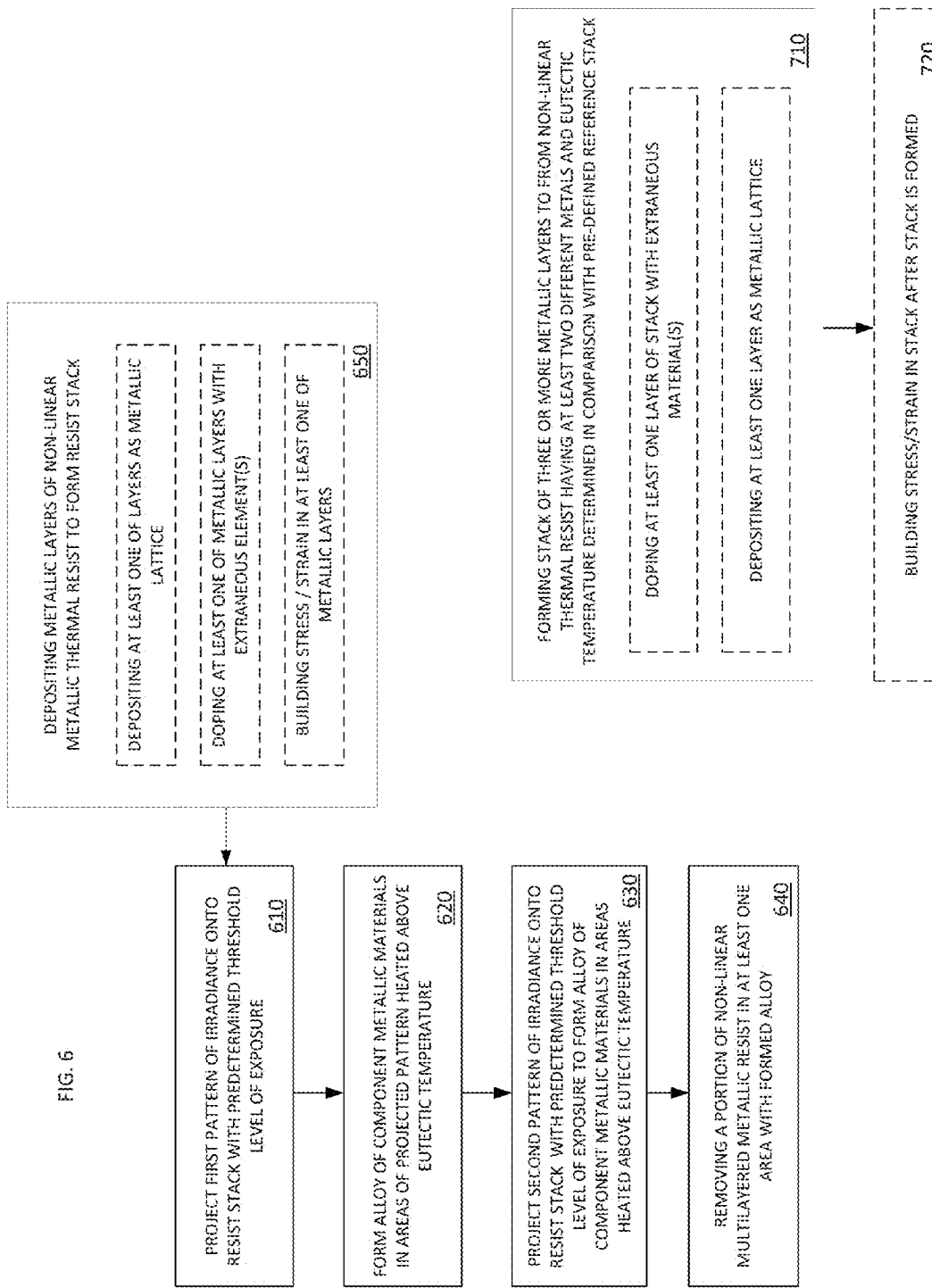

INCREASING AND CONTROLLING SENSITIVITY OF NON-LINEAR METALLIC THIN-FILM RESISTS

CROSS-REFERENCE TO RELATED APPLICATIONS

The present patent application claims priority from and benefit of the U.S. provisional Patent Application No. 61/950,691 titled "Increasing and Controlling Sensitivity of Non-Linear Metallic Thin-Film Resists" and filed on Mar. 10, 2014. The disclosure of the above-identified provisional application is incorporated herein by reference.

TECHNICAL FIELD

This invention generally relates to fabrication of electronic and photonic circuits and, more particularly, to multi-layer non-linear metallic thin-film resists and methods for increasing their sensitivity for use in multi-exposure lithography.

BACKGROUND

It is photoresist technology and materials that have been conventionally used for forming patterns of conductive, semi-conductive, or insulating materials on a substrate in fabrication of devices such as electronic components, integrated circuits, small-scale photonic components, printed circuit boards, and interconnecting components for such devices. Using conventional photoresist materials and methods, a photoresist layer is disposed and patterned onto a substrate or onto other patterned materials so that it either protects or exposes an underlying material for an etching process that follows. The photoresist layer is normally formed of a polymeric, organic material that is substantially unaffected by a metal deposition and/or metal removal processes and, accordingly, is fit to protect underlying areas from etching processes. A pattern is formed by exposing the photoresist material to actinic radiation through an appropriate mask (such as a glass master, for example, often used in photolithographic techniques) or by directly writing of a pattern with an electronic beam. In the first scenario, the incident radiation (such as the UV or X-ray radiation, for example) causes a chemical reaction in the photoresist material, and modifies its relative solubility. The process that follows includes dissolving and removing the unexposed areas, for example, of the photoresist while leaving the exposed portions intact to transfer the pattern towards the underlying substrate.

Conventional UV photoresist etching is a relatively costly process, requiring substantially high-energy radiation sources to drive the needed chemical reactions. Preparation of masks and photo-tools can be very expensive, error-prone, and time-consuming. The use of masking techniques is necessarily limiting the achievable spatial resolution and places considerable demands on the design of supporting optical components. Moreover, conventional photoresist materials behave linearly with respect to subjected dosages (or energy per volume). That is, in the case of a traditional resist material, the overall exposure that is used to create the pattern in the resist material is a sum of the net individual exposures. The final pattern can be determined by the sum of the individual photonic events that create the chemical changes in the traditional material, for example acid site generation and cross linking. This makes traditional resist materials less desirable for technologies that require a sequence of multiple exposures to generate sub-resolution patterns since the traditional resist needs to be exposed, developed and appropriately removed to make visible the first pattern before any additional pattern can be formed on the same material. And the cause of it is, of course, that the traditional resist material permanently records any previous photonic event (interaction with incident light to which such material is sensitive).

In attempts to improve upon the expense and complexity of conventional photoresist etching, a number of alternative fabrication techniques have been adapted. Examples of such alternative methodologies include ablation methods (now recognized to be a poor performer for complex patterning situations that require multiple layers due to leaving hard-to-remove debris on the patterned substrate) and a transfer mask (the shortcoming of the use of which arises from a need to use standoffs causing the loss of spatial resolution of the transferred pattern).

Another alternative to using photoresists that is being researched includes the use of thermal resist materials (and, in particular, non-linear metallic thermal resists). Unlike photoresist substances that undergo chemical changes in reaction to light of high-energy, thermal resist materials undergo chemical or physical reactions in response to heat energy. In general, thermal resist materials are advantageous over photoresists because of their non-linear behavior, simpler chemistry, lower cost, and relative insensitivity to ambient light. Furthermore, in comparison with the traditional resist materials, the use of a non-linear thermal resist is advantageous for the use in multiple exposure lithography. Specifically, unlike the traditional resist material, the non-linear metallic thermal resist does not "remember" prior exposure to light unless it was heated above the eutectic temperature during such prior exposure. As a result, a spatial region or area of the non-linear thermal resist material that has not reached the eutectic temperature reverts to its original material state after the exposure to light is over.

Despite these inherent advantages over photoresists, a number of practical considerations remain before the use of thermal resists becomes versatile. In particular, related art and practical limitations clearly indicate that currently considered non-linear thermal resists lack the sensitivity to activating heat-causing radiation that is necessary for use in multiple-exposure lithography.

U.S. Pat. No. 7,989,146 (Burberry et al.) is but one example that discloses a method for component fabrication using thermal resist materials but do not address the issue of controlling and improving the sensitivity of the deposited thermal resist films. The described non-linear resists described are not applicable to conventional and commercial high-NA scanner pulse irradiances due to their radiation insensitivity. The typical energy flux values required to produce the reactions in the non-linear thermal resist described by Burberry et al. are between 300 mJ/cm$^2$ per pulse and 500 mJ/cm$^2$ per pulse, which values are about 30 to 50 times larger than commercially available high-resolution scanner systems are structured to deliver to the substrate.

While attempts to improve sensitivity of bi-metallic thin-film resists were made (for example, Tu et al. in "Inorganic Bi/In Thermal Resist as a High-Etch Ratio Patterning Layer for CF4/CHF3/O2 Plasma Etch," Proc. of SPIE Vol. 5376, pp. 867-878, 2007 considered varying the thickness of the metallic film), no practical solution to the problem of decreasing the effective heat of transformation required for a metallic thermal thin-film resist to form an alloy. In particular, sensitivity levels sufficient for use of metallic thin-film resists to conventional pulse irradiances from lithography scanners have not been achieved.

The present invention overcomes practical limitations that have been preventing the use of the existing metallic thin-film resists in multi-exposure lithography by providing a new class of higher sensitivity non-linear optimized multi-layer thin-film thermal stacks that enable processes of multi-patterning with pulse irradiances that are less than about 10 mJ/cm$^2$ for use with the now available on conventional high-NA immersion tools, to prevent damaging imaging optical materials and coatings on the substrate that would occur at higher levels of irradiance. These results are achieved by principal, deliberate restructuring the metallic thermal thin-film resists through the use of multi-layer films, material dopants and/or the application of thin-film stresses to decrease the effective heat of material transformation in thermal resists.

SUMMARY

Embodiments of the invention provide a non-linear metallic thermal resist structured to have two or more thin-film layers of different metallic materials such that a first threshold level of exposure is lower than the second threshold level of exposure, the first threshold level being a level of exposure of the non-linear metallic thermal resist to incident radiation required to form an alloy of the different metallic materials, the second threshold level being a level of exposure of a reference non-linear metallic thermal resist to the incident radiation. The reference non-linear metallic thermal resist has a second overall thickness and is structured to have only two thin-film layers of materials from the different metallic materials.

Embodiments further provide a method for patterning a non-linear metallic thermal resist. The method includes a step of forming, on an underlying substrate, a stack of materials including non-linear metallic thermal resist, such resist comprising two or more thin-film layers of different metallic materials such that a first threshold level of exposure (of the non-linear metallic thermal resist to incident radiation) required to form an alloy of the different metallic materials is lower than the second threshold level of exposure of a reference non-linear metallic thermal resist to said incident radiation. The reference non-linear metallic thermal resist has a second overall thickness and is structured to have only two thin-film layers of materials from the same different metallic materials. The method further includes a step of projecting a first pre-determined spatial distribution of light on the stack to cause formation of alloy of the different metallic materials of the stack in first areas of the non-linear metallic thermal resist that are heated above a corresponding eutectic temperature.

Embodiments additionally provide a method for reducing an effective eutectic temperature required to form a multi-metallic alloy as a result of exposure of an area of a non-linear multi-metallic thermal resist to incident radiation. The method includes sequentially depositing a stack of two or more metallic thin-films on a substrate to form said nonlinear multi-metallic thermal resist including two or more different metals. The subject multi-metallic thermal resist has a first effective eutectic temperature that is lower than a second eutectic temperature, where the second eutectic temperature characterizes a reference non-linear multi-metallic thermal resist that has only two metallic thin-film layers made of materials chosen from the different metals.

BRIEF DESCRIPTION OF DRAWINGS

FIG. 2A illustrates a longitudinal cross section of irradiance of the incident beam, while FIG. 2B illustrates a cross-sectional distribution of irradiance of the incident beam.

FIG. 3 provides a list of parameters characterizing materials used in a n embodiment of the invention.

FIGS. 6 and 7 are flow-charts illustrating schematically embodiments of method of present invention.

DETAILED DESCRIPTION

Figure 1A:
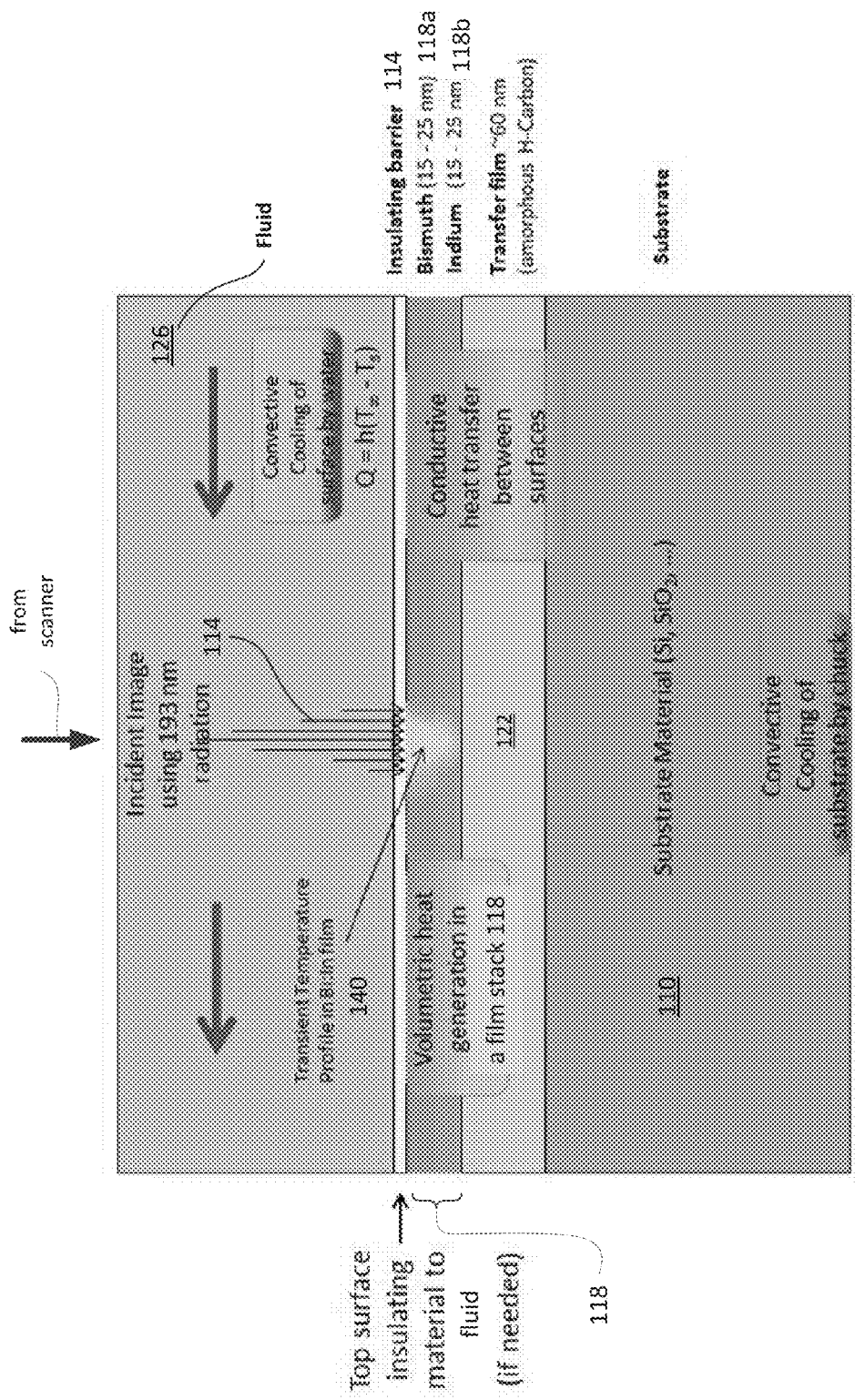
FIG. 1A is a schematic diagram illustrating an example of a five-layer stack of materials disposed on a substrate subject to patterning with a multi-exposure lithographic tool such as a UV scanner that generates a beam having a single-peak cross-sectional profile. The diagram indicates, across a metallic thermal resist layer, a single region heated with the incident beam

The use of metallic non-linear thermal resists employs the fact that an alloy of metallic materials forming such resists (composite materials) is created in an area of the resist that has been heated up above a certain threshold value (referred to as the eutectic temperature and corresponding to latent heat of transformation of the composite materials). In the case of a bi-metallic bi-layer non-linear thermal resist element, an alloy of the two metallic films forming such "alloyed element" is created with proportions corresponding to the composition of the resist formed when the eutectic temperature is achieved. For example, the creation of the alloy composition of $Bi_{53}In_{47}$ can be created from two thin layers of Bismuth and Indium (that have 53% and 47% atomic percentages, respectively) at a eutectic temperature (or eutectic point) of about 110° C. within the bounds corresponding to the area/volume of the resist heated up to an/or above the eutectic temperature. The volumetric shape of the thin-films resist corresponding to the alloy generally depends at least on the profile of the radiation absorbance, the temporal thermal profile within the material caused by absorption of the incident radiation, and the solidification front between the materials in the resist and the decay of the thermal energy between pulses.

The resultant alloy ($Bi_{53}In_{47}$ in this example) exhibits properties that are different from the properties of any of the constituent metallic films, which difference in properties (such as difference in chemical, or mechanical, or physical properties resulting in different sensitivities to etching compositions) can be used to delineate/separate/distinguish the regions occupied by the alloy from non-alloyed regions of the film by, for example, etching a volume occupied by an alloy while leaving the surrounding areas of the thin-films substantially unattended, or vice versa. A person of ordinary skill in the art would appreciate that, in order to successfully utilize a metallic thermal resist in conventionally-employed lithographic systems without substantial modifications of such systems and/or without substantial modifications of the already-established lithographic processing parameters, it would be preferred for such a non-linear resist film to have a sensitivity to resist-activating radiation (that is, to radiation causing the heating-up of the conventionally used resistive materials and exposing a desired imaging pattern thereon) that is comparable with the sensitivity of conventional resist material(s).

High-volume manufacturing of electronic circuits require ever decreasing feature size (with a current target on the order of several tens of nm). The fabrication of electronic circuits with features on such small spatial scale with photolithographic immersion technology currently relies on the application of multi-patterning (or multi-step-patterning) of resistive materials, deposited on a substrate on which the desired pattern (interchangeably referred to herein as stencil or template) has to be eventually transferred. The wavelength of radiation used for this purpose may generally vary, depending on the available sources of radiation and absorptive properties of the used resistive materials and, in one example, such activating or illuminating radiation has a wavelength of or about 193 nm.

Sec. 1) Conventional PhotoResists

Process(es) of exposure of the currently used conventional resist materials to the activating radiation produce pattern features that are limited in resolution by the "latent" or "stored" image areas/volumes within which the incident radiation interacted with the photoresist material. In non-catalyzed resist systems (such as those based on novalac and diazide napthaquinone (DNQ) materials, for example) this is generally represented by the concentration of the changed photoactive group (or photo-compound) that is used to change the solubility of the exposed versus unexposed resist in the post process to delineate the pattern through development (typically an aqueous base solution such as NaOH or KOH). With the introduction of chemically amplified resist systems that are commonly used for shorter wavelength exposure (used in deep-UV lithography, for example), the latent image can be associated with the concentration of photo-acid sites that are generated by the interaction of the incident radiation with the photo-acid generators (PAGs). In either case, the latent image is stored by the photoresist material and even the photoresist regions that have experienced low level of exposure retain the concentrations of photo-acid sites. Accordingly, the limit of spatial resolution of the resulting pattern in the photoresist material is substantially determined by the resolution of a single exposure.

During the patterning process of a resist exposure (in an advanced lithographic system employing the immersion lens) the spatial half-pitch resolution of a feature that can be produced in a single exposure step is limited by a certain critical value associated with the "Rayleigh Criterion", which determines the resolvable image. This value can be estimated as $$\frac{k_1 \lambda}{(n_{fluid} NA)}$$

and, for $n_{fluid} \sim 1.44$; $NA \sim 0.95$; $\lambda \sim 193$ nm; $k_1 \sim 0.3$, is about 42 nm.

Important to note is that the above equation relates to the pitch value, not the feature size. Although the full pitch resolution limit for our system above was estimated to be 84 nm, the target feature size at this pitch could be a value that is significantly less than the full-pitch. For example, current systems are very capable of producing sub-20 nm features (line or a space) at minimum pitch (84 nm in our case). The issue with conventional linear resist materials is retained latent image. A second exposure that is used to produce another sub-20 nm feature would result in a "washed" out final image. Hence the first pattern must be developed and the substrate that the pattern is created on must be recoated with "new" unexposed resist. Only then can a second sub-20 nm pattern at 84 nm pitch be created between the first sub-20 nm pattern. The net result from this "double" exposure example above would be a sub-20 nm pattern at 42 nm full-pitch.

The need to remove portions of the resist to create the above pattern entails handling the substrate carrying such resist material, repositioning of the substrate with respect to the lithographic tool and/or mask (which repositioning is necessarily characterized by a certain degree of inevitable spatial imprecision) and understandably leads, overall, to "smearing" of the resulting feature of the pattern. This situation is further exacerbated by the fact that, to properly expose a resist layer to a complex pattern corresponding to the pattern corresponding to a combination of elements and/or component of electronic circuitry inevitably involves a multi-step, processing-wise complicated use of multiple exposure masks (even per a given resist layer of interest) that have to be spatially positioned, mutually and/or with respect to the chosen fiducial points, with required precision and accuracy. As a result, the overall manufacturing process becomes very complex and causes significant impact on manufacturing throughput and cost(s) of the final product.

Sec. 2) Taking Advantage of Possibilities of Non-Linear Metallic Thermal Resists The use of bi-metallic two-layered non-linear thermal resists instead of conventional resists is advantageous over the use of conventional resists. Indeed, the non-linear thermal resists do not have a stored "latent image" problem, in that even in the area of exposure to activating radiation they do not change their material properties (do not form alloys of constituent metals) across all areas exposed to the radiation but only to those portions of the exposed area(s) which have been heated up to (and above) the eutectic temperature. Accordingly, multi-step exposure and multi-patterning resulting in forming complex patterns on the same thermal resist are possible. Moreover, no correction for the proximity effect is required for a feature of the pattern and a subsequent "thermal delayed" feature.

The present invention is directed to improving spatial resolution of UV-lithographic patterning with the use of non-linear metallic thermal thin-film resists and increasing the manufacturing throughput while lowering the cost of the patterning process by devising novel non-linear metallic thermal resist structure(s) that possess increased sensitivity (to the activating radiation used in a typical lithographic system) which, in turn, drastically reduces the optical density currently required for the patterning of a metallic thermal resist.

Accordingly, as discussed in detail in the present disclosure, and according to embodiments of the invention:

A problem of modifying sensitivity of a metallic thin-film resistive element to pre-determined activating incident radiation is solved by structuring such element as a multi-layer thin-film stack, where the number of layers exceeds 2. In other words, the desired tailoring of sensitivity to the element-patterning radiation is effectuated by restructuring a conventionally-used bi-metallic two-layer thin-film resistive element as a bi-metallic three- or more layer thin-film resistive element. In a specific implementation, the overall thickness of an element restructured according to an idea of the invention is substantially equal to that of a conventional bi-layer operating under similar conditions. In another specific implementation, at least one of the layers in such metallic thin-film stack is deposited under conditions resulting in a mechanical stress built-in to a layer and a corresponding reduction of eutectic temperature required for forming alloy from as compared with the same layer deposited without such stress;

A problem of reducing the level of irradiance required for multi-exposure lithography of a metallic thin-film resistive stack disposed on or carried by a substrate subject to lithographic patterning is solved by deviating from a conventional two-layer design of the thin-films resistive stack made of the materials of choice and structuring such stack to include a number of layers exceeding two. The restructuring results in at least ten-fold increase in sensitivity to the activating radiation and, accordingly, to at least ten-fold reduction of the threshold level of exposure required for processing the metallic thin-film resist. As a corollary of such reduction, the possibility of optical damage of auxiliary optical materials and coating present on the substrate is substantially reduced;

A problem of substantial elimination of optical damage of materials and coatings disposed on or carried by a substrate subject to patterning in a multi-exposure lithographic system is solved by significantly reducing the level of irradiance required, in operation of a multi-exposure lithographic system, for exposure of a metallic thin-films resist disposed on the substrate by structuring such resist as a thin-film bi-metallic stack having more than two alternating metallic layers. In a specific implementation, in addition, at least one of the alternative layers is deposited under conditions resulting in a built-in-the-layer mechanical stress and/or dopant sites distributed across the layer, thereby effectively reducing eutectic temperature for forming an alloy (at the portions of the resist exposed to the activating radiation) even further;

A problem of reducing the effective eutectic temperature, at which multi-metallic alloy is formed as a result of exposure of an area of a multi-metallic thin-film resist (disposed on a substrate subject for patterning with a multi-exposure lithographic tool) to activating radiation, is solved by (i) structuring such thin-film resist as a thin-film stack in which the number of layers exceeds two and/or (ii) depositing these layers on the substrate under conditions that result in either (ii-a) mechanical stress built in at least one of these layers and/or (ii-b) doping of at least one of the layers with a material that is different from host metallic materials;

A problem of optimization of an overall multi-layer thin-film stack (carried by a substrate subject for patterning with a multi-exposure lithographic tool), of which a non-linear metallic multi-layer thermal resist containing more than two metallic layers is part, is solved such that the multi-layer thermal resist is characterized by rate of absorption of activating incident radiation that is maximized under the circumstances. Such solution is achieved, in part, by structuring the top coating layer covering the non-linear resist to simultaneously minimize its reflectivity and maximize transfer of the radiation to the underlying layers. In addition, such solution is achieved by simultaneous optimization of the layers below the multi-layer metallic thin-film resist (including, for example, the etch-transfer planarization layer and other underlying coating(s)) to provide maximized reflectance of the incident energy back to the thin-film metallic resist.

As broadly used and described herein, the reference to a material layer such as an electrode being "carried" on a surface of an element refers to a layers that is disposed directly on the surface of an element or disposed on another coating, layer or layers that are disposed directly on the surface of the element.

In thin films, local heating can be achieved by subjecting (or exposing) the films to radiation such as, for example, focused light from a laser source, conventional light source (lamps), extreme UV source, particle beams including electron- and ion-beams, x-ray radiation, to name just a few. The energy from such activating radiation creates heat through the direct excitation of the electrons (photo-absorption effect) and phonons (lattice vibrations) in the exposed film(s). The radiative heating of the film(s) can be spatially localized, and such ability to spatially localize the heating of the film(s) enables film "patterning" effectuated when the localized temperature creates a permanent effect (or change) to the film media. In the example of a bi-metallic thermal resist, the example of media change is provided by the formation of an alloy, from the two metal films, within boundaries of the area that has been heated up above the corresponding eutectic temperature.

According to the idea of the invention, thermal properties of the films forming the metallic thermal resist and the corresponding boundary conditions (defined, in part, by other materials present next to the metallic thermal resist) are used to improve the spatial localization of the radiation (and the corresponding heating effect) to provide well-defined boundaries of the heated-up areas of the thermal resist by, for example, minimizing the effects of radiation scattering, thermal spatial profiles, and reflection(s) within the stacks of materials. One method to improve the efficiency of the localized heating of the thin-film metallic thermal resists by incident activating radiation is to optimize the thicknesses of the film forming the stack in order to maximize the absorption of radiation by the stack. In doing so, the energy absorption should be maximized for the metallic films themselves and minimized, at the same time, for other nearby-located materials (such as the top-surface anti-reflecting material and the material that is used to support the metallic layers).

To this end, FIG. 1A provides an example of a typical layered material system disposed on a substrate-to-be-patterned, 110, with the use of a chosen activating radiation 114 (as shown, at 193 nm). The layered material system includes a non-linear metallic thermal resist conventionally structured as a bi-metallic two-layer thin-film stack 118 (shown, in this example, to include a bi-layer of bismuth and indium metallic films, 118a and 118b).

This conventionally structured non-linear thermal resist is carried by an optionally disposed on the surface of the substrate 110 layer of an etch-transferring film 122 (as shown, a film of H-carbon). The layer of immersion fluid 126 (in one case—water), through which the activating radiation 114 is delivered to the non-linear metallic thermal resist 118, may be optionally separated from the non-linear metallic thermal resist 118 by an insulating barrier layer 130, which is used for protecting the non-linear thermal resist materials 118A, 118B from erosion by the fluid 126 and to improve the transfer of incident radiant energy. The substrate 110 can be disposed on a chuck element (not shown) operable as a heat sink.

FIG. 1A additionally illustrates thermal process(es) that have to be optimized in order to minimize the spatial spearing of the transient spatial thermal profile of the area 140, heated up by the activating radiation 114 delivered from a high-NA immersion optical element(s) of the scanning system (not shown). Among these processes, there are present a process of volumetric heating of the bi-layer 118 with the incident radiation 114 (the formation of transient temperature profile in the area 140); a process of convective cooling of the bi-layer 118 by the fluid 126; a process of conductive heat transfer between and among the surfaces formed by neighboring layers; and a process of heat transfer from the substrate 110 to the heat-sink (chuck, maintained at a constant temperature), if present.

It is understood that the specific patterning areal element 140 (and the corresponding transient spatial temperature profile) generally corresponds to the cross-sectional profile of the beam of the incident radiation 114. For example, a single area 140 understandably corresponds to a single-spatial-peak profile of the incident radiation 114, while a two-hump profile 220 shown in FIGS. 2A, 2B would result in two areas of heating 140A, 140B at the bi-layer 118 located side by side, as schematically shown in FIG. 1B.

Sec. 3) Assessment of Radiant Exposure in a Lithographic Tool.

Figure 1B:
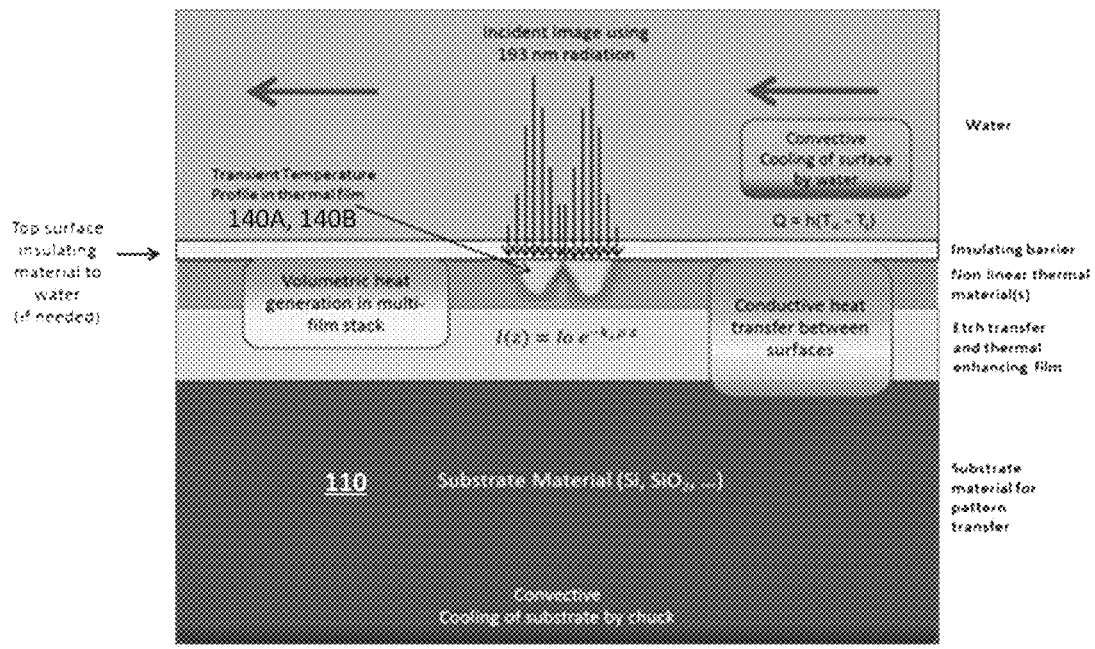
FIG. 1B is a schematic diagram similar to that of FIG. 1A and indicating, across a bi-metallic thermal resist layer, two regions heated with the incident beam of radiation that arrives at the stack from the multi-exposure lithographic tool and has a two-peak cross-sectional profile.
Figures 2A, 2B:
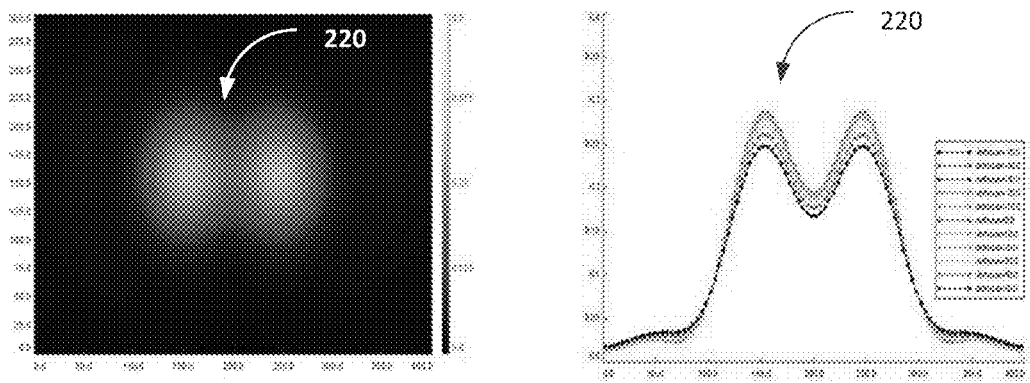
FIGS. 2A and 2B illustrate, respectively, a two-spatial-peak beam of incident radiation delivered to the metallic thermal resist layer of the diagram of FIG. 1B by a multi-exposure lithographic tool.

The assessment of the process of heating of the overall film stack at issue—such as that of FIGS. 1A, 1B—may be carried out by modeling of heat transfer with the use of a three-dimensional (3D) transient heat conduction equation $$\rho(T)C_p \frac{\partial T}{\partial t} = \frac{\partial}{\partial x}\left[K(T)\frac{\partial T}{\partial x}\right] + \frac{\partial}{\partial y}\left[K(T)\frac{\partial T}{\partial y}\right] + \frac{\partial}{\partial z}\left[K(T)\frac{\partial T}{\partial z}\right] + F_i - F_r - F_{\Delta H_a} \quad (1)$$

where $F_i$=incident absorbed power=$I(x, t)$ $[1-R(T)]e^{-z[1-R(T)]}$; $F_r$=reradiated power=$\epsilon(T)\sigma$ A $T^4$; $F_{\Delta H}$=latent heat absorbed during phase-change to create alloy; $\Delta H$=$\Delta$Enthalpy (Bi:In$\rightarrow$Bi$_{53}$In$_{47}$) in J*g$^{-1}$; $\rho(T)$ is the material density as a function of temperature; $C_p$ is the specific heat capacity at constant pressure; T is temperature; t is time, K(T) the thermal conductivity as a function of temperature; R(T) the optical reflectance as a function of T; I(x,t) is the laser radiation power density; $\epsilon(T)$ is the total emissivity as a function of temperature (~0.34 for Bismuth); $\sigma$ is Stefan-Boltzmann's constant; and A is the area of re-radiation. The temperature-dependent material parameters, inclusive of phase-change of the metallic thermal resist from separate metals to alloy, can be determined with the use of one of known finite difference schemes such as, for example, Crank-Nicolson scheme, Classical Implicit procedure, Classical Explicit procedure, or Levy explicit method.

Figure 4A:
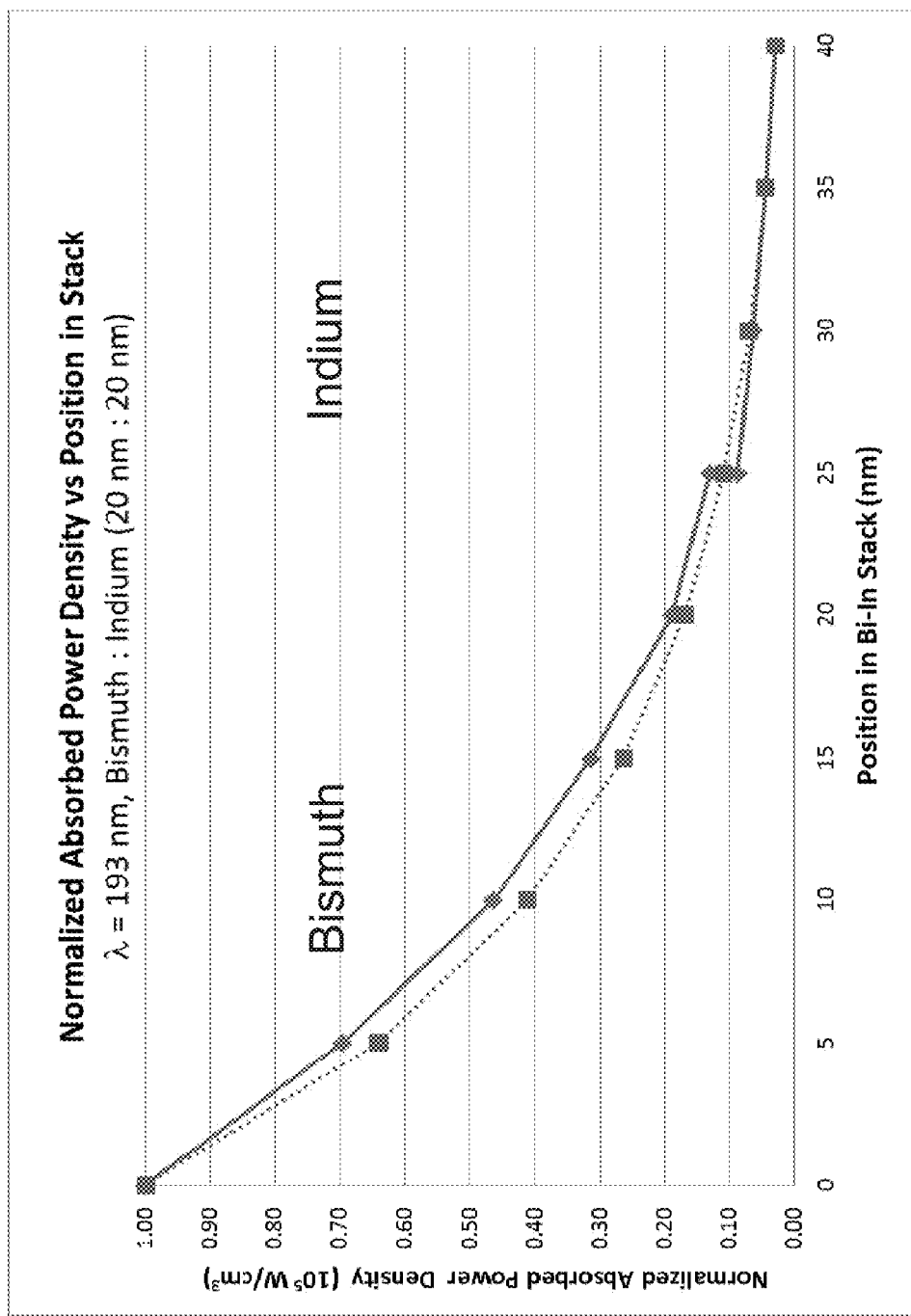
FIG. 4A is a plot of absorption of a conventional not optimized Bi/In two-layer thin-film thermal resist calculated with the use of parameters of FIG. 3.

Solving Eq. (1) with the use of the Classical Explicit procedure, for example, and using the material parameters summarized in FIG. 3, the distribution of energy absorbed by the two-layer thermal resist 118 of FIG. 1A (the absorption profile in a thermal resist stack for volumetric heat generation) can determined (one practical example is shown in FIG. 4A).

Sec. 4) Principles of Optimization of a Film Stack Carried by the Substrate Subject to Patterning According to an Embodiment of the Invention.

Further optimization of the transient temperature profile in the thermal resist film such as film 118 includes the optimization of at least (1) a top-coat layer (which doubles as an anti-reflection coating and an energy-transfer layer) such as a "Shipley" anti-reflecting coating, to improve the absorption and minimize reflected energy from the stack; this layer may also be used as a stack insulating barrier from the surface water for an immersion optical system, (2) a thin-film metallic layer 118a (such as Bi, Te, Sn, to name just a few);

(3) a thin-film metallic layer 118b (such as, for example, In, Pb, Fe, to name just a few); and (4) a supporting etch-transfer layer 122 (which may be, for example, an amorphous H-carbon as shown in FIG. 1A or a low-absorption organic or inorganic polymer (e.g. fluoropolymers, organic resist materials since they are not used in the imaging process). The etch transfer film 122 can be additionally optimized (using material constants and thermal properties of such film) to improve the pattern fidelity to minimize lateral thermal transfer and aid in the reflection of energy among the layers of the layered structure During a cycle of exposure, heat is created in the material(s) of a film stack disposed on the substrate by the absorption of the activating incident radiation (193 nm and/or other wavelength(s)) formed into a spatial distribution corresponding to the chosen pattern by the optics of the photolithographic exposure tool. The absorption process heats the film stack and, providing the irradiance is above a certain threshold, modifies the material of the metallic thermal resist film stack above a threshold temperature, $T_n$. The absorption of radiation by the film stack may be found from consideration of the incident electromagnetic field and boundary conditions as well as the optical properties of the films. The parameters of the films should be (i) optimized to improve the distribution of temperature across the pattern of irradiance formed on the film stack and (ii) adjusted during such optimization to allow for sufficient thermal dissipation over a short period of time corresponding to a typical pause between the irradiance pulses of the lithographic exposure tool. Stated differently, the film stack should be designed in such a way that it dissipates the thermal latent image or pattern formed at the film stack by one pulse of light via conductive heat transfer prior to the arrival of the next pulse. In the film stack shown in FIG. 1A or 1B, for example, the exposure to the radiant energy absorbed by the non-linear thermal resist can be improved and the sensitivity of the thermal resist to such radiation can be improved when:

1. The thicknesses of the metallic films are chosen to achieve maximum power density absorption;

2. The thickness of the bottom etch transfer film 122 is chosen to minimize absorption of the transferred radiation and to provide optimal reflection of activating radiant energy from the substrate 110 back to the metallic stack;

3. The top surface coating 114 is structured to minimize the reflection of incident radiant 114 and to maximize a power-flux transfer to the metallic films lying underneath.

At least these three above-identified optimization processes should be considered together, simultaneously for the whole stack carried by the substrate 110. To improve the irradiance transfer and to minimize the associated reflectivity, the top surface coating 114 of the stack may include a thin film with a gradient refractive index distribution along a direction of radiation incidence, where the value of the index at the top surface of the layer 114 substantially matches that of the immersion fluid (n=1.44 in the case of water) and with the value of the index at the bottom surface that substantially matches the index of the top layer of the metallic film stack (as shown—the index of the metallic film 118a).

In performing the calculation for energy flux and power density of radiation incident on and interacting with the stack 118, the following assumption can be made:

A Gaussian temporal pulse profile: $P(t)=P_{max}\exp(-0.5[(t_0-t)/\sigma]^2$, where $t_p$ is the temporal width (full-width-half-maximum) for the laser pulse, measured in nanoseconds, and $\sigma=t_p/(2\sqrt{\ln 2})$; and The energy flux $E_d$ (microJoules/cm$^2$) represents the energy flux delivered per pulse, or the integrating of the power flux over time: $E_d \int_{-\infty}^{\infty} P_{max}\exp(-0.5[(t_0-t)/\sigma]^2 dt$;

The peak power flux, therefore, can be determined as $P_{max}=(2E_d/t_p)\sqrt{2\ln 2/\pi}$. For $E_d$=147 microJoules/cm$^2$ and $t_p$=1.0 ns, $P_{max}$=1.328565*1.47 [J/m$^2$]/(1.0*10$^{-9}$ [sec])=1.953*10$^9$ W/m$^2$.

Figure 4B:
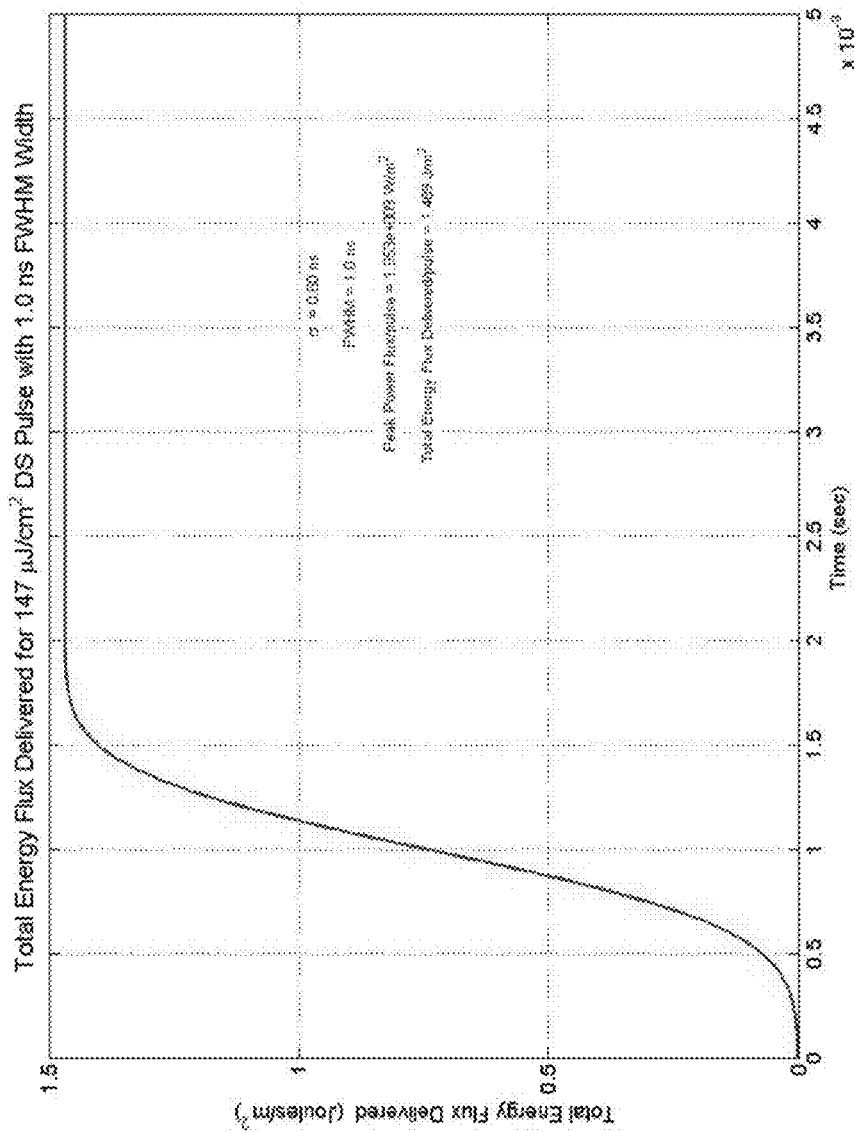
FIGS. 4B, 4C, 4D, and 4E provide plots illustrating different steps of optimization of the resist of FIG. 4A and comparison of results thereof.
Figure 4C:
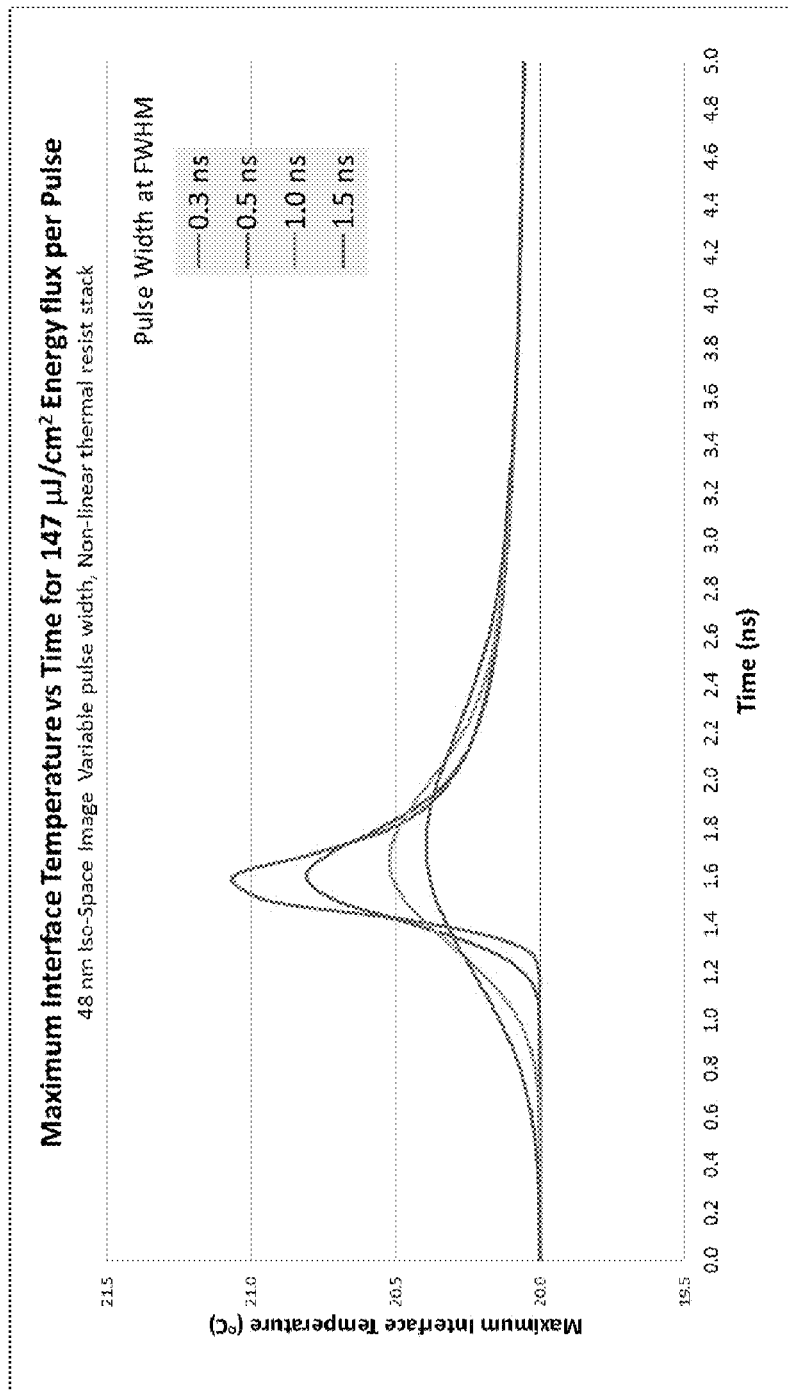
Figure 4D:
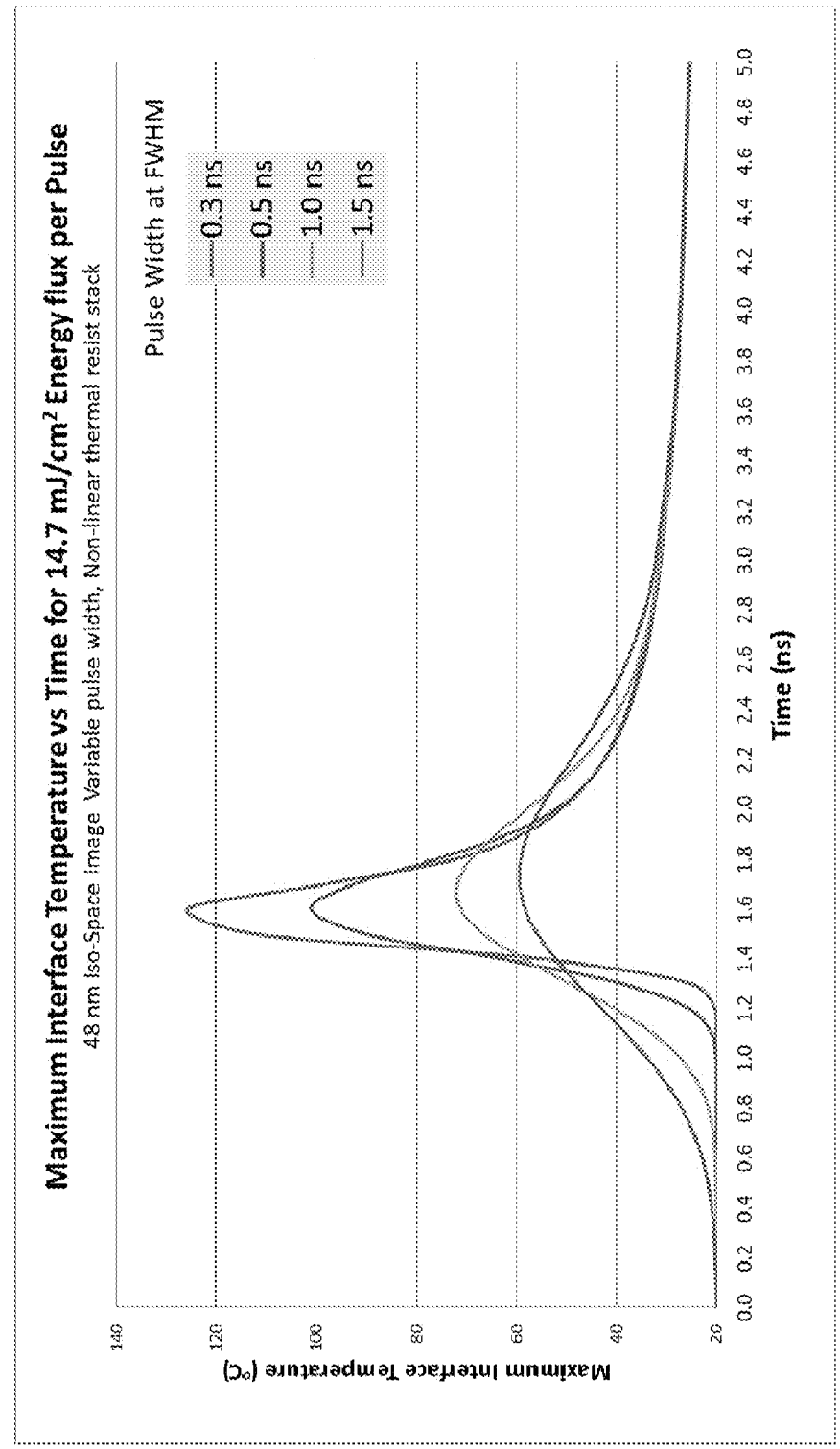
Figure 4E:
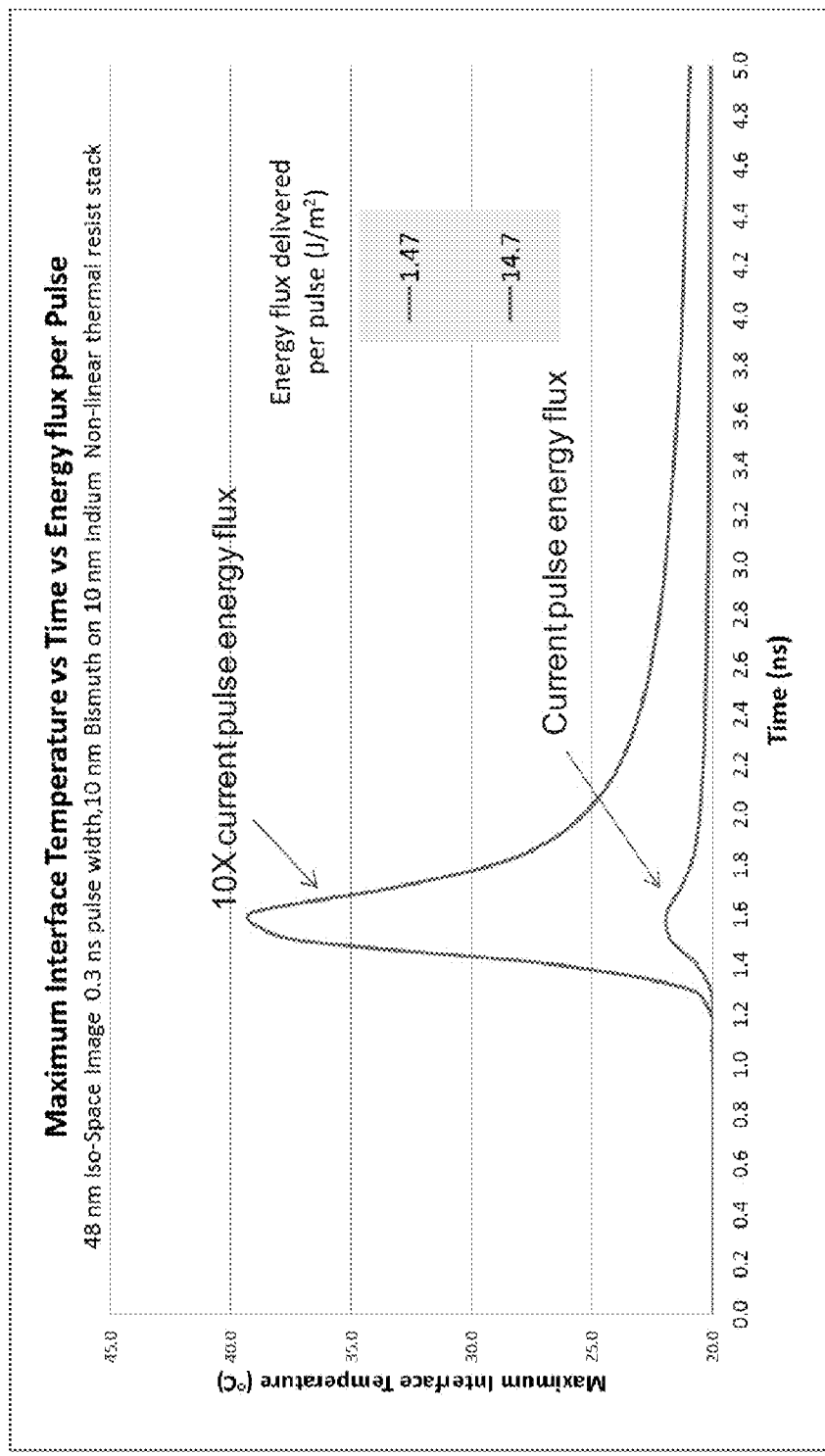

Moreover, it can be reasonably assumed that the pulse power flux decays with the depth in the material due to the Beer's law absorption and according to $F_i(z)$/incident absorbed power=$P_d e^{-\alpha z}$, and that the total energy flux is absorbed by the bi-metallic thin-film stack at thickness $z_b$. Here, $F_i$ is the incident power density in units of W/m$^3$ and $P_d$ is the peak power density, $\alpha$=0.089 is the absorption coefficient for the Bismuth-Indium stack. The volumetric heat generation must be normalized by the thickness, $z_b$, to get to the proper power density in W/m$^3$. The normalized absorbed power density as a function of the position within the not-yet-optimized bi-metallic two-layer stack 118 of FIG. 1A, calculated under these assumptions, is shown in FIG. 4A. FIG. 4B is a plot showing the energy flux delivered to the stack 118 of FIG. 1A per laser pulse (the power flux integrated over the pulse). FIG. 4C shows a plot demonstrating temperature increase of the stack 118 of FIG. 1A (at the interface between the Bi and In layers, each layer being about 20 nm thick) as a function of the duration of the incident laser pulse radiation, for energy flux of 147 microJ/cm$^2$ per pulse. The difference between the temperature increase caused by a pulse of 1.5 ns and that caused by a pulse of 0.3 ns is less than 2 C. For comparison, temperature increase achievable in the same Bi—In two-layer stack corresponding to the energy flux of 14.7 mJ/cm$^2$ per pulse (for several values of pulse durations from 1.5 ns to 0.3 ns) is shown in FIG. 4D. It can be seen that, with such energy density the eutectic temperature can be reached for 0.3 ns pulses. The comparison, shown in FIG. 4E, between the maximum temperature increase achievable with a 0.3 ns pulse delivering 147 microJ/cm$^2$ per pulse at the Bi—In interface in the case when Bi and In layers are each about 20 nm thick, and the maximum temperature increase achievable with a 0.3 ns pulse delivering 14.7 mJ/cm$^2$ per pulse at the Bi—In interface in the case when Bi and In layers are each about 10 nm thick provides evidence that thinning the Bi and In layers in a bi-metal two-layer non-linear thermal resists structure may provide additional increase in sensitivity to incident activating radiation.

Further assessments show, however, that even the complex, multi-variable optimization of the conventional stack of materials (such as that of FIG. 1A) according to the optimization method of the invention disclosed above may not be entirely sufficient. In order to advantageously utilize bi-metallic non-linear thermal two-layer such as resist 118 of FIG. 1A (with two layers of about 20 nm thick each), the required dose of radiant exposure levels are substantially, about two orders of magnitude, higher than those provided by a laser source currently used at, for example, 193 nm, in a typical lithographic scanner (considering a dose of radiation delivered to the resist per an approximately 1 ns long pulse). Even when laser pulse length is reduced to, for example, 0.3 nm, and after further optimization of the film stack is performed according to the principles outlined in Sec. 4, the radiant energy density provided by the laser sources of the current lithographic systems can be still shown to be not necessarily sufficient to ensure that the thermal resist 118 is heated up to the eutectic temperature and forms alloy at the exposed to the activating radiation area.

However, the seemingly obvious solution—to increase the level of radiant exposure by increasing the energy of the incident beam 114 (of FIG. 1A)—begs a question of detrimentally affecting the material characteristics of the other layers of the stack and the substrate of FIG. 1A. At least for this reason such solution may not be desired.

Sec 5) Examples of Structure of a Non-Linear Metallic Thermal Resist and Methods for Fabrication of Same According to the Idea of Present Invention.

(5.1) According to an embodiment of the invention, the conventional stack 118 described above is restructured to improve its sensitivity to the incident radiation. The goal of such improvement is to increase the sensitivity, as a result of which the thermal resist of interest will form an alloy, in the area exposed to the incident activating radiation, at lower levels of radiation.

In one implementation, a bi-metallic two-layered thermal resist is restructured to include a number of layers exceeding two. For the purposes of the present disclosure, a multi-layer thin-films structured is defined as a layered thin-film structure having more than two layers. As a result of such restructuring, the total common interface area between the constituent metals (in one example—Bi and In), which have the lowest melt temperatures is increased and, as a result, the alloy-formation is enabled at lower energy densities. In addition, the thicknesses of individual films in such multi-layer non-linear metallic thermal resist have been optimized according to the methodology disclosed in Sec. 4, with the use of the software package Essential Macleod® to achieve maximum absorbance of radiation in the individual metallic films.

Figure 5A:
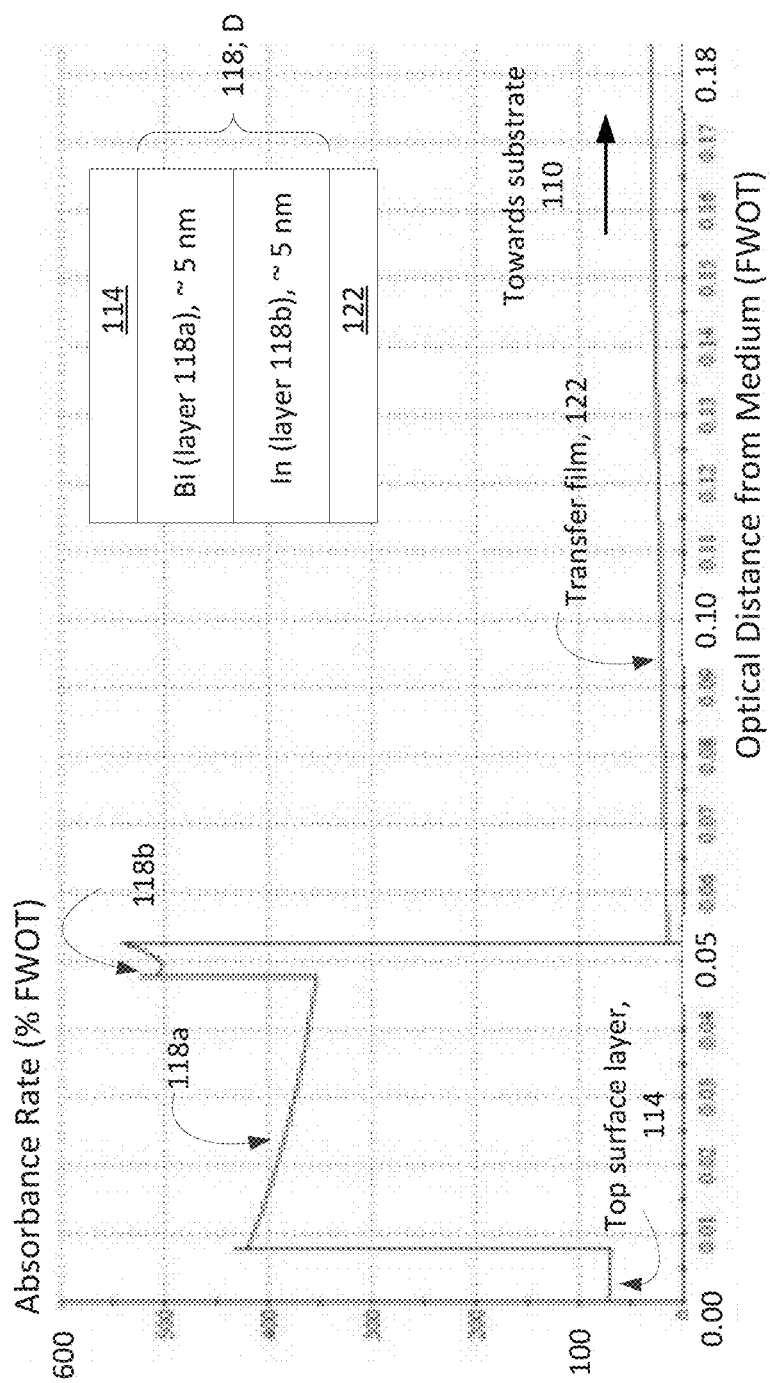
FIGS. 5A and 5B: The calculated absorbance rate for a bi-layer stack. The maximum absorbance on the plot is 500% of the full wave optical thickness (FWOT). Plot of FIG. 5B shows the calculated absorbance rate for the multi-layer stack (of the same thickness) but now using four Bismuth-Indium films also optimized according to an embodiment of the invention. Note that the maximum absorbance rate is over 10× higher than the stack shown in FIG. 5A.
Figure 5B:
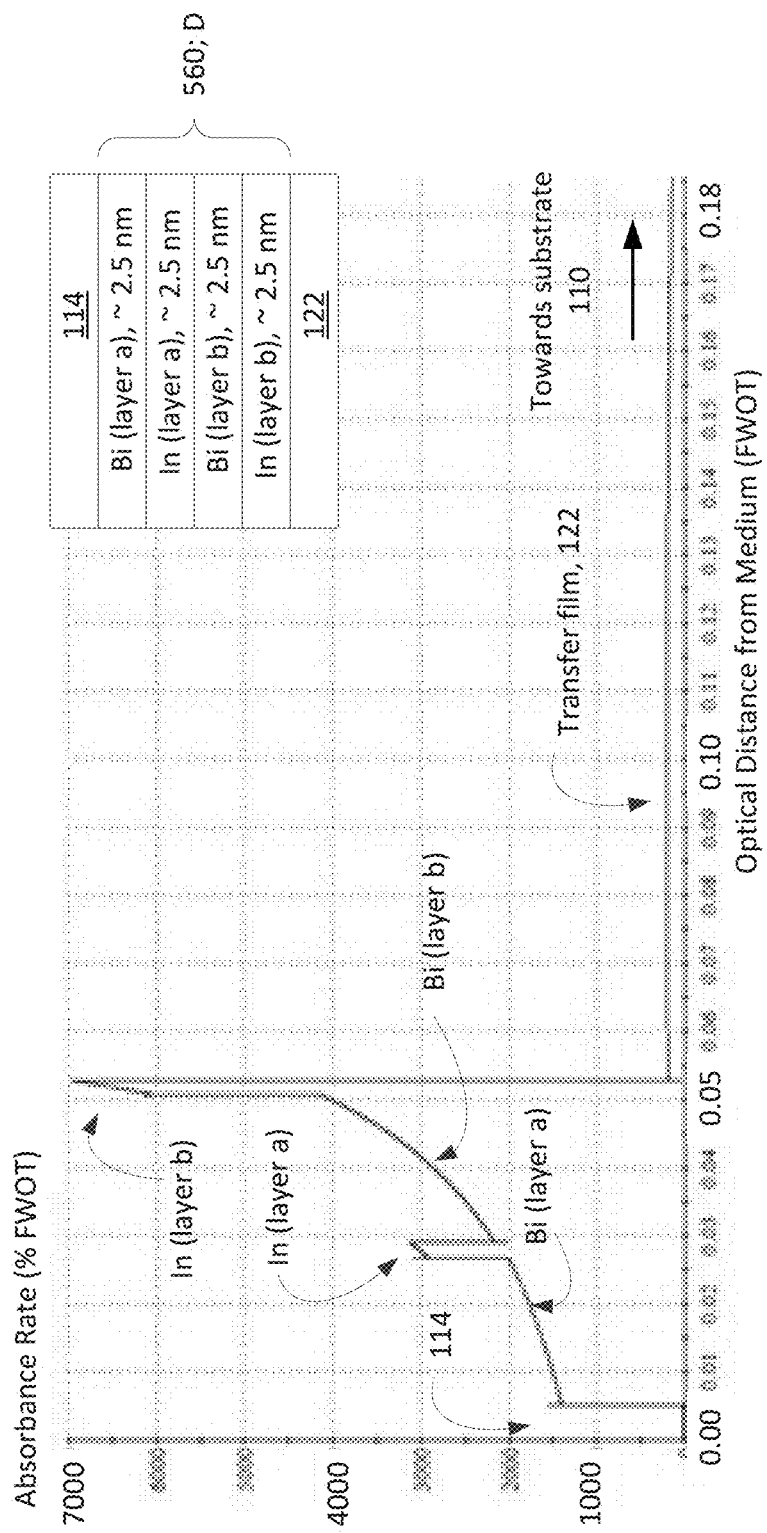

FIGS. 5A and 5B provide the plots 500 and 550, expressing, respectively, the calculated absorbance rate across a bi-metallic bi-layer thermal resist 118 (in which the total geometrical thickness of the Bi and In layers 118a, 118a is about 10 nm) and the corresponding absorbance rate across an embodiment 560 of a bi-metallic multi-layer thermal resist the structure of which is shown in insert of FIG. 5B. The total thickness D of the resist 560 is about 10 nm, which substantially equals to the total thickness of the bi-layer 118a+118b).

Increase in the number of interface regions between the constituent metals forming the embodiment of the thermal resist increases the absorption of incident radiation and, corresponding volume of alloy creation, since it is a surface of interface between the metals that exhibits the lowest melting point (and, therefore, melts first). Since the volumetric heating scales or changes directly with absorbance, an embodiment of the metallic thermal resist stack exhibits increased sensitivity and, in practice, creates the alloy with the same incident 193 nm irradiance (mJ/cm$^2$). An analysis of a conventional metallic two-layer stack 118 with the use of a transient thermal heat conduction program (RSICC COMPUTER CODE COLLECTION HEATING 7, providing multidimensional finite-difference heat conduction analysis) yielded an estimated sensitivity of about 2.3 mJ/cm$^2$. At the same time, the sensitivity of the multi-layer stack 560 exhibited a sensitivity estimated to be about 0.2 mJ/cm$^2$.

In other words, FIG. 5B shows that, as a result of substitution of a 10 nm thick conventional two-layer film stack of near-equal parts of Bismuth and Indium with an equally thick four-layer stack of alternating Bi and In layers (~2.5 nm thickness per layer), the absorbance rate (or the measure of the decrease in energy absorbed as it passes through the thin-film thermal resist is unexpectedly increased by more than 10 fold.

It is appreciated that, similarly, the absorbance rate is increased when a bi-metallic two-layer non-linear thin-film resist made of other appropriate metals is restructured to include more than two layers. Moreover, increase in absorbance rate due to such restructuring done according to the idea of the present invention occurs also for higher-order-metallic thermal resists (such as, for example, a tri-metallic resist, or a resist including more than three metal components).

Examples of multi-metallic thermal resists are provided by thermal resists that include any combination of, for example, Gallium, Indium, Bismuth, Antimony, Tin, Lead, Cadmium, and Aluminum. The mixed-and-matched combinations of two or more of any of these materials would be pre-arranged in the thin-film stack with thicknesses that correspond to correct proportions for the alloy creation. The thin-film stack itself can be considered as the "pre-cursor" alloy. One specific example of a stack that would benefit from this approach is Wood's metal, which has the composition of four parts of Bismuth, two parts of Lead, one part of Tin and one part of Cadmium, and that has an unusually low melting temperature.

In a specific embodiment, the multi-layer metallic thermal resist is formed with multi-layer lattices (superlattice) of the corresponding metallic films. Structuring the multi-layer resist in such a fashion increases the total common interface area between the metals which have the lowest melt temperatures. The materials in the lattice are individually deposited or grown in an epitaxial reactor, float zone or other method such as sputtering at high-vacuum. The growth of the initial (first) layer may be deposited (as discussed above), then annealed to assure good lattice integrity. Subsequent layers, such as the case of the Indium and Bismuth multi-layer stack would be grown above that initial layer. Low temperature rapid anneal may be used to assist in the formation.

(5.2) According to a related embodiment, the metallic thin-films in a multi-layer incarnation of the thermal resist of the invention are fabricated with stressed metallic films or lattices, where the stress is built-in during the metal deposition process. As a result of such stress-building, the internal free energy of the overall multi-layer metallic resist structure is increased and the "effective" eutectic temperature corresponding to the formation of the alloy (of the constituent metals) to be formed is reduced as compared with the analogous thin-film stack that is devoid of a built-in stress.

This method of increasing the metallic thermal resist sensitivity relies on increasing the internal energy of the first constituent-metal matrix to lower the effective latent heat of fusion for the formation of the first metal—second metal (for example, Bi—In) alloy. According to the idea of the invention, thin metallic non-linear resist films are created using epitaxial deposition on the underlying transfer film, and the strain or stress in a metallic film may be built-in to the thermal resist structure.

(5.3) According to yet another implementation of the idea of the invention, at least one dopant material is introduced into a metallic film during its deposition at the stage of creating an embodiment of the thermal resist such as to decrease the effective eutectic alloy point. The dopant can also be used to increase the free-energy of the multi-layer stack and to increase the local absorption (of incident energy).

EXAMPLE 1

During the deposition process the separate layer(s) are deposited using cyclical temperatures. This approach concerns a sequence of deposition of metallic thin-films using different temperatures. As an example, the first film of the multi-layer structure is deposited on the substrate at a temperature $T_{substrate}$, while the second film layer is subsequently deposited at a temperature $T_{substrate}+\Delta$, where $\Delta$ represents an increment (or decrement, depending on a particular implementation) in temperature from that of the substrate layer. (The value of $\Delta$ can be estimated based on the following considerations: It is appreciated that, generally, the operably appropriate temperature change $\Delta$ is dependent on the expansion coefficient of the deposited films and, in practice, would be limited to that corresponding to a change of the atomic lattice constant by about 0.01% to about 0.03% or so. In case of Bismuth, for example, which has an expansion coefficient of $16.6*10^{-6}$/deg C., the atomic lattice will expand/contract by 16.6 microns per meter of length for each degree in temperature change. A 0.01% change of the lattice constant (4.75 Angstroms) is $4.77*10^{-4}$ Angstroms. Considering about $2.1*10^9$ atoms in a linear meter of Bismuth material, the temperature change that provides expansion/contraction per atom is about $2.1*10^9*4.75*10^{-14}/(16.6*10^{-6})=6$ deg C. In practice, therefore, the value of $\Delta$ is between a few degrees (for example, 5 degrees C.) and about 20 degrees C.) This process is then repeated until all of the thin-films are deposited. The net result is a "strained superlattice" structure with an increase (or decrease) of the independent lattice constants by a few percent. The net structure (film) has a higher internal free energy that is used in the transition from "multi-layer" to "alloyed" film. The resultant film stack is built with a pre-melt stress that destabilizes the equilibrium of the metallic matrix.

EXAMPLE 2

During the deposition process, the stress in the deposited structure is built by adding additional species into the material being deposited. The introduced species may include another metal or semiconductor element chosen such as to not change the thermal properties of the original multi-layer stack (that is used for the non-linear imaging). A non-limiting example of additional species appropriate for use with the stacks discussed above includes Pb, Sn, Ga, Si, Ge, Hg, Zr, Ti. Introduction of impurities to the deposition process can be effectuated, for example, by using an additional gas for vapor deposition (such as nitrogen and/or oxygen). In a sputter deposition process, where the atoms are deposited by using the "sputtered or knocked-off" atoms from a target "ingot" using a high-energetic beam (such as the beam of ions, electrons, or even neutral atoms hitting the target that is often heated), the additional species may include, for example, the same Pb, Sn, Ga, Si, Ge, Hg, Zr, Ti. By adding these impurities into the layer (or lattice), the layer (or lattice) are caused to incorporate a few defects (that contain the gaseous element) which can distort and cause stress or strains to the regular array (of atoms). The net result of this process is similar to that describe in Example 1. This approach is turning on the introduction of another element (with larger or smaller atomic radius) in the deposition process to increase (or decrease) the local lattice spacing, and can be used for modification of materials to enable lower critical temperatures.

EXAMPLE 3

During the deposition process (epitaxial growth), an additional layer is introduced (intermediate with respect to the layers of constituent metals) of material forming atomic spacings (lattice constant) that are nearly equal to those of the constituent metals, to form an intermediate stress or strain causing material interface. Here, atoms of the metal are deposited on a similar crystalline surface that is compatible with the structure of the material that is being deposited. When the two materials have similar structures, e.g. lattice constants that are close in value, the deposited film tends to align with the underlying film. In one implementation of the multi-layer metallic resist stack discussed above (such as Bi—In based stack), a layer of $In_xBi_{1-x}$ could be introduced to create a strained-layer lattice, the value of x being variable. (Other non-limiting examples of strained layers include $Ga_xAs_{1-x}$, $TiN_xVN_{1-x}$, $In_xIn$—$As$—$Ga_{1-x}$, $ZnSe_xSe_{1-x}$.

EXAMPLE 4

As a result of implantation of chosen species into an already-deposited metallic film/lattice. This can be used as a post-implant step to cause deposited impurities and to induce stress or strain to the deposited film. This method is also attractive as it may be used to increase the absorption of the energy through local scattering (of the incident photons). Here, stress (or strain) are created in the thin-films using implantation of new species. This method may also be used to introduce a species that effectively lowers the eutectic point. For example, Wood's metal, which has the composition of four parts of Bismuth, two parts of Lead, one part of Tin and one part of Cadmium has an unusually low eutectic temperature of 70° C.

Overall it is appreciated, therefore, that embodiments of structure and methods for fabrication of non-linear metallic multi-layer thermal resists of the present invention enable a long-sought solution to the adjustment of sensitivity of thermally-activated bi- (or higher-order) metallic resists. Disclosed non-limiting examples utilize metallic materials that form alloys at a low "eutectic" temperature point (between about 70 C and about 120 C). The formed alloy has a hardness and etch resistance that is higher than the non-alloy film stack and serves, during the lithographic processing, as an etch stop.

The use of embodiment of the invention solves the problems plaguing methodologies that are currently used in multi-exposure lithography, which is the current "best practice" to extend and print patterns below the pitch resolution with 193 nm high-NA optical immersion tools. This current practice relies on two or more exposures and a sequence of intermediate steps between the exposures of a photosensitive material (photoresist). The intermediate processing steps include: 1) development of the photoresist, 2) etching or freezing the spatial pattern formed in such developed photoresist; 3) re-coating the surface of the patterned photoresist with another layer of the photosensitive (resist) material; and then 4) re-aligning and exposing the substrate to create features between the previous patterns. These conventionally needed intermediate steps are required to remove the latent image that is "stored" in the photoresist material with each exposure. For conventional photoresists, if the appropriate portion of the photoresist material is not removed (and then developed and etched) after exposure, the subsequent image exposures merely add sequentially and are superimposed with the first latent "stored" image in the resist, detrimentally affecting the precision and spatial resolution of the aggregate pattern through which the substrate will be eventually etched.

Furthermore, in stark contradistinction with the use of conventional photoresist materials, embodiments of non-linear thermal resist and method of their fabrication as disclosed in this application can be used with multi-exposure without requiring a removal (partial or otherwise) of such resists from the substrate that carries such non-linear thermal resist and/or recoating of the imaging material between the multiple exposure.

Notably, while the disclosure of WO 02/06897 concerns the basics of creating create a multi-layer inorganic film resist layers, it is silent with respect to any optimization directed at improvement of the sensitivity of the resulting layer. In stark contradistinction with the disclosure of WO 02/06897, the presently discussed methodology results in improvements to sensitivity of the resist multi-layer structures that startlingly exceeds that of WO 02/06897 by at least an order of magnitude. This is achieved by deliberately introduced modifications of the deposited film layers through in multi-layer films, dopants or the application of thin-film stresses to decrease the effective heat of transformation (to form the alloy).

With the introduction of a sensitive non-linear thermal metallic resist according to an embodiment of the invention, the problem of the presence of the "latent image" in the currently-used resist materials is solved: these non-linear thermal metallic resists do not carry a latent image and hence can be re-exposed in subsequent steps that results in a surface pattern characterized by dimensions that are only limited to the "line width" of the alloy that is created during each exposure.

FIG. 6 illustrates schematically a method for patterning a wafer with light, effectuated according to an embodiment of the invention. At step 610, a first pattern in light irradiance is projected onto a non-linear multi-layered metallic thermal resists stack having at least two thin-film layers of different materials and a level of threshold exposure defined to be lower than that of a reference stack. Alloys of constituent metals contained in the irradiated thermal resist stack are formed in the areas of the projected pattern that are heated above the corresponding eutectic temperature, at step 620. Additional exposure of the thermal resist stack—this time, to a second pattern of irradiance, and, optionally, without an intermediate step of removal of a material of the thermal resist stack—is carried out at step 630, followed by removal of a portion of the stack in an area with alloy of metallic constituents. In one implementation, the method may also include a step 650 of formation of the target non-linear metallic thermal resist with at least two layers. Optionally, the formation of the resist stack via deposition is accompanied with at least one of depositing at least one of the constituent layers as a metallic lattice; doping at least one of the layers with a chosen dopant; and building stress and/or strain into at least one layer of the stack.

FIG. 7 illustrates schematically an embodiment of the method for reducing an effective eutectic temperature that is required in order to form a multi-metallic alloy by exposing an area of a non-linear multi-metallic thermal resist stack to the incident radiation. Such method includes a step 710 of formation of the stack containing at least two layers (optionally accompanied by doping of at least one layer with a chosen dopant and/or depositing at least one layer in the form of a metallic lattice). Additionally, the method may include a step of building stress and/or strain in the stack after the stack has been formed, 720.

While the description of the invention is presented through the above examples of embodiments, those of ordinary skill in the art understand that modifications to, and variations of, the illustrated embodiments may be made without departing from the inventive concepts disclosed herein. The invention should not be viewed as being limited to the disclosed examples.

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

If the schematic flow chart diagram is included, it is generally set forth as a logical flow-chart diagram. As such, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Without loss of generality, the order in which processing steps or particular methods occur may or may not strictly adhere to the order of the corresponding steps shown. The invention as recited in claims appended to this disclosure is intended to be assessed in light of the disclosure as a whole.

It is appreciated that at least some of the processing steps resulting in transformation of data, acquired with the use of the system of the invention, can be performed with the use of a processor controlled by instructions stored in a tangible, non-transitory storage memory. The memory may be random access memory (RAM), read-only memory (ROM), flash memory or any other memory, or combination thereof, suitable for storing control software or other instructions and data. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The invention as recited in claims appended to this disclosure is intended to be assessed in light of the disclosure as a whole, including features disclosed in prior art to which reference is made.

While the description of the invention is presented through the above examples of embodiments, those of ordinary skill in the art understand that modifications to, and variations of, the illustrated embodiments may be made without departing from the inventive concepts disclosed herein. The invention should not be viewed as being limited to the disclosed examples.

What is claimed is:

1. A method for patterning a non-linear metallic thermal resist, the method comprising:
   identifying a first threshold level of exposure, to incident radiation, of a reference structure of a first two-layer stack of respective different first and second metallic materials on a first substrate
      wherein a total thickness of the reference structure is defined by a sum of thicknesses of the first and second reference thin-film layers;
      and
      wherein the first threshold level of exposure is a threshold level of exposure required to form an alloy of said first and second materials in said reference structure;
   forming a second thin-film stack on a second substrate, the second thin-film stack (i) containing at least N=3 alternating layers of said different first and second materials, (ii) having a second threshold level of exposure to the incident radiation that is more than ten times lower than the first threshold level of exposure while, at the same time, and (iii) having an overall thickness that is equal to the total thickness, by employing at least one of:

depositing one or more of said at least N alternating layers at a temperature that is different from a temperature at which another of said at least N alternating layers is deposited to induce a change in a lattice constant of said one or more of said at least N layers;

introducing an intermediate layer between two of said at least N alternating layers, said intermediate layer having a lattice constant different from lattice constants of any of the first and second materials;

adding, into one or more of said at least N layers, metallic or semiconductor species not present in the first and second materials during a process of deposition of the one or more of said N layers; and implanting material species, not present in the first and second materials, into said second thin-film stack after the second thin-film stack has been deposited;

wherein the second threshold level of exposure is a threshold level of exposure required to form an alloy of said first and second materials in said second thin-film stack;

projecting a first pre-determined spatial distribution of said incident radiation on the second thin-film stack to cause formation of the alloy of the first and second materials in first areas of said second thin-film stack heated by said incident radiation above a eutectic temperature corresponding to the second threshold level of exposure that is insufficient to cause formation of alloy of the first and second materials in the first two-layer stack.

2. A method according to claim 1, further comprising additionally projecting a second pre-determined spatial distribution of said light on the target thin-film stack to cause formation of alloy of the first and second materials in second areas of said second thin-film stack heated by said light above the eutectic temperature.

3. A method according to claim 2, wherein a thickness of each constituent thin-film layer of said second thin-film stack is less than 5 nm, and wherein any of said projecting and additionally projecting includes exposing said second thin-film stack to pulsed laser light with irradiance less than 2.3 mJ/cm$^2$ and causes formation of said alloy.

4. A method according to claim 2, that is devoid of a step of removing at least a portion of said second thin-film stack between a step of said projecting and a step of additionally projecting.

5. A method according to claim 1,
wherein said first and second materials include In and Bi, respectively,
wherein as a result of said forming, the second thin-film stack is characterized by a curve that represents a rate of absorbance of said incident radiation as a function of depth of the second thin-film stack;
wherein the depth of the second thin-film stack is measured from a surface of the second thin-film stack on which said radiation is incident;
and wherein said curve has a positive slope in each segment thereof representing absorption of said incident radiation in a corresponding one of said at least N alternative layers.

6. A method according to claim 1,
wherein said first and second materials include In and Bi, respectively,
wherein the first two-layer stack is characterized by a curve that represents a rate of absorbance of said incident radiation as a function of depth of the first two-layer stack;
wherein the depth of the first two-layer stack is measured from a surface of the first two-layer stack exposed to said incident radiation;
and
wherein said curve has a negative slope in at least one segment thereof representing absorption of said incident radiation in at least one of layers of the first two-layer stack.

7. A method according to claim 1, wherein any of said adding and said implanting causes building stress or strain in at least one of constituent thin-film layers of the second thin-film stack during said forming.

8. A method according to claim 1,
wherein said first and second materials include In and Bi, respectively, and wherein at least one of the following is satisfied:
said introducing an intermediate layer includes introducing a layer of $In_xBi_{1-x}$, and
said adding includes adding any of Pb, Sn, Ga, Si, Ge, Hg, Zr, Ti to form a defects, one or more of said at least N layers, that contain a gaseous element.

9. A method for reducing an energy flux of radiation required to form a multi-metallic alloy as a result of exposure of an area of a non-linear multi-metallic thermal resist (NLMTR) to said radiation, the NLMTR having a first overall thickness defined by a sum of thicknesses of two constituent thin-film metallic layers thereof, said constituent thin-film metallic layers being made of two different materials, the method comprising:

altering a design of a structure of composed of two constituent thin metallic layers NLMTR to increase a number of constituent thin-film metallic layers thereof and to define a thin-film stack that has a bigger number of thin-film layer interfaces than that in the NLMTR while having a second overall thickness equal to the first overall thickness, the second overall thickness defined by a sum of thicknesses of constituent thin-film metallic layers of said thin-film stack;
and
sequentially depositing constituent thin-film layers of said thin-film stack on a substrate to form a target nonlinear multi-metallic thermal resist that is characterized by
(a) having the two different materials, and
(b) an altered energy flux of radiation required to form a multi-metal alloy as a result of exposure of an area of said thin-film stack to said radiation, the altered energy flux being more than ten times smaller than the energy flux required to form a multi-metallic alloy as a result of exposure of the NLMTR to said radiation,
wherein said sequentially depositing includes at least one of
i) depositing the constituent thin-film layers at different temperatures to modify a lattice constant of at least one of said constituent layers;
ii) forming dopant sites in at least one of said constituent thin-film layers of the target thin-film stack with material species absent from the two different materials;
iii) introducing an intermediate layer between first and second of said constituent thin-film layers of the target thin-film stack, said intermediate layer having an atomic spacing that differs from an atomic spacing of any of said constituent thin-film layers; and iv) implanting material species, absent in the first and second materials, into said second thin-film stack after the second thin-film stack has been deposited.

10. A method according to claim 9,
wherein said two different materials include In and Bi, respectively,
wherein as a result of said sequentially depositing, the thin-film stack is characterized by a curve that represents a rate of absorbance of said radiation as a function of depth of the thin-film stack;
wherein the depth of the thin-film stack is measured from a surface of the thin-film stack exposed to said radiation;
and wherein said curve has a positive slope in each segment thereof representing absorption of said radiation in a corresponding one of the constituent thin-film layers.

11. A method according to claim 9, wherein said sequentially depositing includes depositing at least one metallic thin-film layer structured as a lattice, wherein thicknesses of each of the constituent thin-film layers of said thin-film stack is less than 5 nm.

12. A method for patterning a non-linear metallic thermal resist, the method comprising:
forming, on an underlying substrate, a stack of materials including the resist that has a first overall thickness and three or more alternating thin-film layers of two different metallic materials such that a first threshold level of exposure, of the resist to incident radiation, required to form an alloy of the different metallic materials is more than ten times lower than a corresponding second threshold level of exposure of a reference non-linear metallic thermal resist to the incident radiation,
depositing, on the resist, a barrier layer configured to protect the different metallic materials from erosion by an immersion fluid,
projecting, through the immersion fluid, a first pre-determined spatial distribution of light on the stack such as to cause formation of alloy of the different metallic materials of the stack in first areas of said resist heated above a corresponding eutectic temperature,
wherein said reference non-linear metallic thermal resist has a second overall thickness and structured to have only two thin-film layers of the same different metallic materials, the first and second overall thicknesses being equal,
wherein said forming includes at least one of
i) depositing sequential layers of said three or more thin-film layers at different temperatures;
ii) forming dopant sites in at least one of said three or more thin-film layers, said dopant sites containing materials not present in said two different metallic materials; and
iii) introducing an intermediate layer between said three or more thin-film layers, a first of the three or more thin-film values having a first atomic spacing, a second of the three or more thin-film values having a second atomic spacing, the intermediate layer formed from a material with a third atomic spacing, the third atomic spacing being greater than the first atomic spacing and smaller than the second atomic spacing.

13. A method according to claim 12, further comprising additionally projecting a second pre-determined spatial distribution of light on the stack to cause formation of alloy of said different metallic materials in second areas of said resist heated above a corresponding eutectic temperature.

14. A method according to claim 13, wherein any of said projecting and additionally projecting includes exposing said stack to pulsed laser light with irradiance equal to or less than 10 mJ/cm$^2$.

15. A method according to claim 12 that is devoid of a step of removing at least a portion of said stack between steps of said projecting and said additionally projecting.

16. A method according to claim 12, further comprising depositing said resist on the underlying substrate such as to form a multi-layered metallic film at least one layer of which is configured as a lattice.

17. A method according to claim 12, further comprising doping at least one of said different metallic materials.

18. A method according to claim 12,
wherein said two different metallic materials include In and Bi,
wherein as a result of said forming, the resist is characterized by a curve that represents a rate of absorbance of said incident radiation as a function of depth of the resist;
wherein the depth of the resist is measured from a surface of the resist on which said radiation is incident; and
wherein said curve has a positive slope in each segment thereof representing absorption of said incident radiation in a corresponding one of said three or more alternating thin-film layers.

* * * * *